(12) United States Patent
Ogasawara

(10) Patent No.: US 9,299,535 B2
(45) Date of Patent: Mar. 29, 2016

(54) MULTI CHARGED PARTICLE BEAM WRITING APPARATUS

(71) Applicant: NuFlare Technology, Inc., Yokohama (JP)

(72) Inventor: Munehiro Ogasawara, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/638,786

(22) Filed: Mar. 4, 2015

(65) Prior Publication Data
US 2015/0255249 A1 Sep. 10, 2015

(30) Foreign Application Priority Data

Mar. 4, 2014 (JP) ................................. 2014-041814

(51) Int. Cl.
| | | |
|---|---|---|
| *H01J 37/30* | (2006.01) | |
| *H01J 37/141* | (2006.01) | |
| *H01J 37/153* | (2006.01) | |
| *H01J 37/317* | (2006.01) | |
| *H01J 37/04* | (2006.01) | |

(52) U.S. Cl.
CPC ........... *H01J 37/3177* (2013.01); *H01J 37/045* (2013.01); *H01J 37/3007* (2013.01); *H01J 2237/043* (2013.01); *H01J 2237/0492* (2013.01); *H01J 2237/12* (2013.01); *H01J 2237/3173* (2013.01)

(58) Field of Classification Search
CPC ...................... H01J 37/3177; H01J 2237/0435; H01J 37/045; H01J 2237/31754; H01J 2237/045; H01J 2237/31774; H01J 37/10

USPC .......... 250/396 R, 397, 492.2, 492.3, 492.22; 430/296, 942
See application file for complete search history.

(56) References Cited

U.S. PATENT DOCUMENTS

| | | | |
|---|---|---|---|
| 5,378,917 A | 1/1995 | Chalupka et al. | |
| 5,801,388 A | 9/1998 | Stengl et al. | |
| 5,874,739 A | 2/1999 | Buschbeck et al. | |
| 6,326,632 B1 | 12/2001 | Buschbeck et al. | |
| 8,927,941 B2 * | 1/2015 | Touya et al. | 250/396 R |
| 2013/0078577 A1 * | 3/2013 | Yamazaki | 430/296 |
| 2013/0082187 A1 * | 4/2013 | Ogasawara | 250/396 ML |
| 2013/0252145 A1 * | 9/2013 | Matsumoto | 430/30 |
| 2015/0102231 A1 * | 4/2015 | Matsumoto | 250/396 R |

FOREIGN PATENT DOCUMENTS

| | | |
|---|---|---|
| JP | 6-13280 | 1/1994 |
| JP | 9-511090 | 11/1997 |
| JP | 10-149794 | 6/1998 |
| JP | 2000-164508 | 6/2000 |
| JP | 2006-261342 | 9/2006 |

* cited by examiner

*Primary Examiner* — Nikita Wells
(74) *Attorney, Agent, or Firm* — Oblon, McClelland, Maier & Neustadt, L.L.P.

(57) ABSTRACT

A multi charged particle beam writing apparatus includes an aperture member to form multiple beams, a blanking plate in which there are arranged a plurality of blankers to respectively perform blanking deflection for a corresponding beam in the multiple beams having passed through a plurality of openings of the aperture member, a blanking aperture member to block each beam having been deflected to be in OFF state by at least one of the plurality of blankers, a first grating lens, using the aperture member as gratings, to correct spherical aberration of the charged particle beam, and a correction lens configured to correct high order spherical aberration produced by the first grating lens.

10 Claims, 13 Drawing Sheets

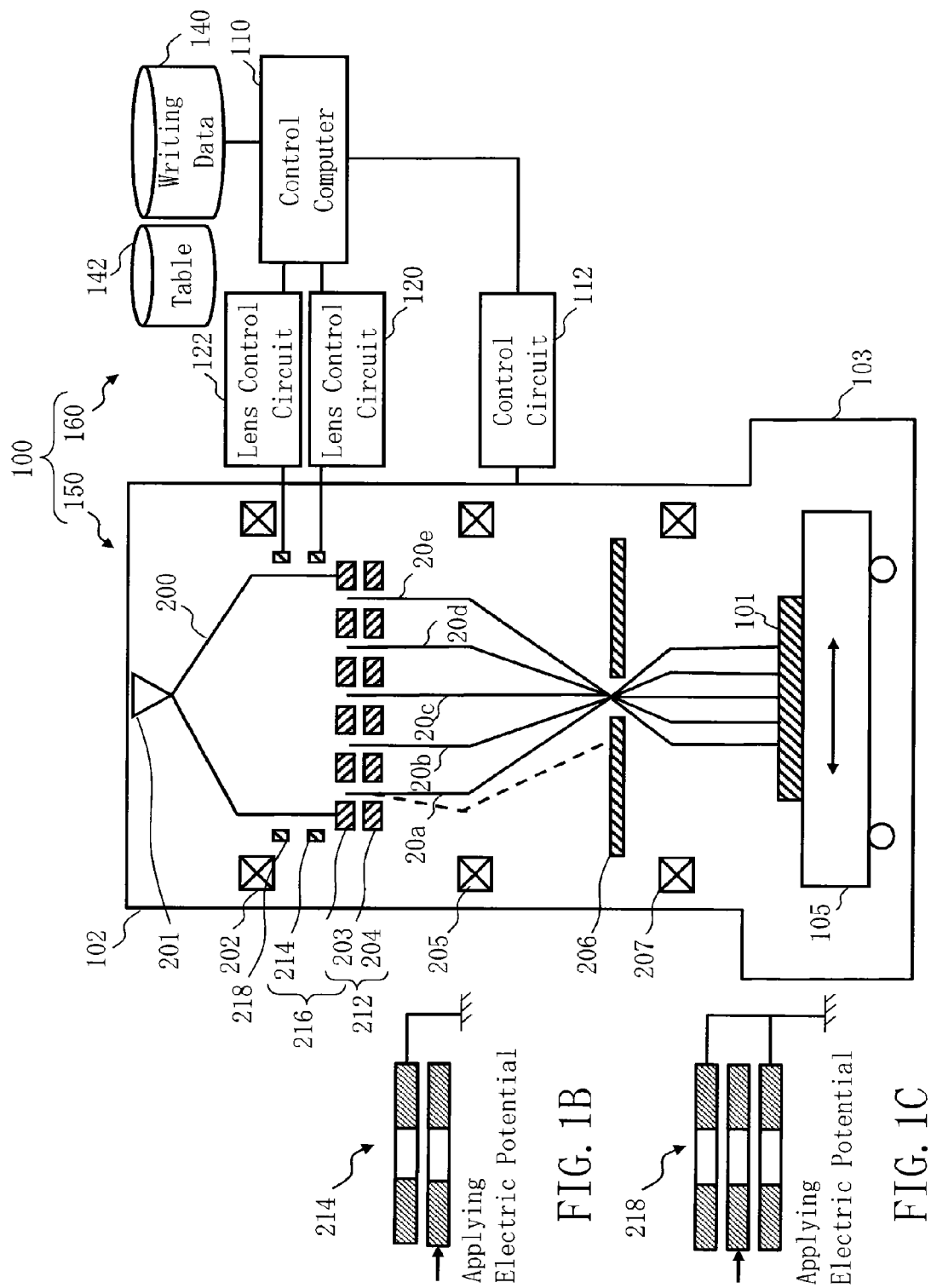

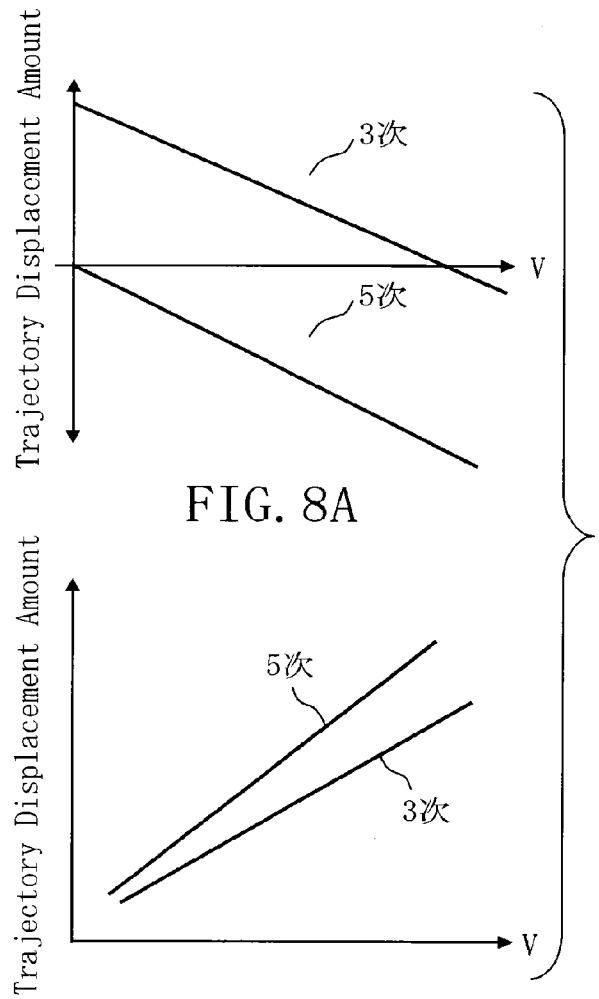
FIG. 8A
FIG. 8B
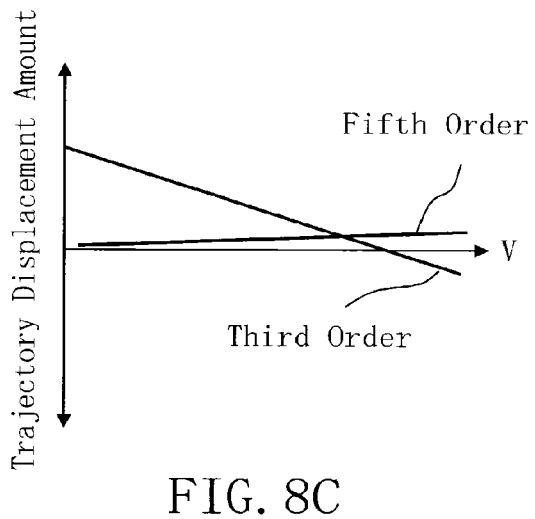
FIG. 8C

MULTI CHARGED PARTICLE BEAM WRITING APPARATUS

CROSS-REFERENCE TO RELATED APPLICATION

This application is based upon and claims the benefit of priority from the prior Japanese Patent Application No. 2014-041814 filed on Mar. 4, 2014 in Japan, the entire contents of which are incorporated herein by reference.

BACKGROUND OF THE INVENTION

1. Field of the Invention

The present invention relates to a multi charged particle beam writing apparatus. More specifically, for example, the present invention relates to a method of correcting aberrations produced when irradiating multi-beams onto a target object on the stage.

2. Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is decreasing year by year. The electron beam (EB) writing technique, which intrinsically has excellent resolution, is used for writing or "drawing" a pattern on a wafer and the like with electron beams.

As an example employing the electron beam writing technique, a writing apparatus using multiple beams (multi beams) can be cited. Compared with the case of writing a pattern by using a single electron beam, since it is possible to emit multiple beams at a time in multi-beam writing, the throughput can be greatly increased. For example, in a writing apparatus employing a multi-beam system, multiple beams are formed by letting an electron beam emitted from an electron source assembly pass through a mask with a plurality of holes, blanking control is performed for each of the beams, and each unblocked beam irradiates a desired position on a target object (refer to, e.g., Japanese Published Unexamined Patent Application (JP-A) No. 2006-261342).

In multi beam writing, since the beam size of the entire multi-beams is large, aberrations on the optical axis of a crossover image forming system become large. Therefore, it is necessary to form an aperture (contrast aperture) for blanking arranged near a crossover to have a large aperture diameter. However, when the diameter of the aperture is large, a new problem occurs in that it becomes necessary to increase a blanking voltage for blanking control. Therefore, it is desirable to make geometric aberrations themselves of multi-beams small.

BRIEF SUMMARY OF THE INVENTION

According to one aspect of the present invention, a multi charged particle beam writing apparatus includes a stage configured to mount a target object thereon and to be continuously movable, an emission unit configured to emit a charged particle beam, an aperture member, in which a plurality of openings are formed, configured to form multiple beams by letting a region including a whole of the plurality of openings be irradiated with the charged particle beam and letting portions of the charged particle beam respectively pass through a corresponding opening of the plurality of openings, a blanking plate in which there are arranged a plurality of blankers configured to respectively perform blanking deflection for a corresponding beam in the multiple beams having passed through the plurality of openings of the aperture member, a blanking aperture member configured to block each beam having been deflected to be in OFF state by at least one of the plurality of blankers, a first grating lens, using the aperture member as gratings, configured to correct spherical aberration of the charged particle beam, and a correction lens configured to correct high order spherical aberration produced by the first grating lens.

According to another aspect of the present invention, a multi charged particle beam writing apparatus includes a stage configured to mount a target object thereon and to be continuously movable, an emission unit configured to emit a charged particle beam, an aperture member, in which a plurality of openings are formed, configured to form multiple beams by letting a region including a whole of the plurality of openings be irradiated with the charged particle beam and letting portions of the charged particle beam respectively pass through a corresponding opening of the plurality of openings, a blanking plate in which there are arranged a plurality of blankers configured to respectively perform blanking deflection for a corresponding beam in the multiple beams having passed through the plurality of openings of the aperture member, an illumination lens configured to illuminate the charged particle beam onto the region of the aperture member, a blanking aperture member configured to block each beam having been deflected to be in OFF state by at least one of the plurality of blankers, and a foil lens, arranged between the illumination lens and the aperture member, configured to correct spherical aberration of the charged particle beam.

BRIEF DESCRIPTION OF THE DRAWINGS

FIGS. 1A to 1C are conceptual diagrams showing a configuration of a writing apparatus according to a first embodiment;

FIGS. 8A to 8C are examples each showing a relation between the amount of trajectory displacement of multi-beams and voltage applied to a lens according to the first embodiment;

DETAILED DESCRIPTION OF THE INVENTION

Figure 2A:
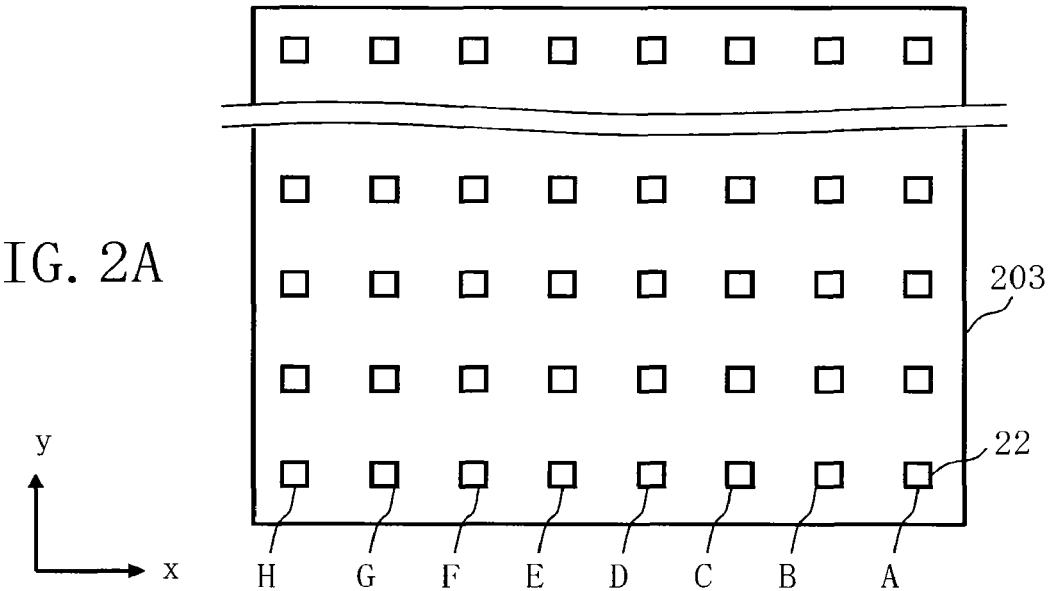
FIGS. 2A and 2B are conceptual diagrams each showing a configuration of an aperture member according to the first embodiment.

In the following embodiments, there will be described a configuration in which an electron beam is used as an example of a charged particle beam. The charged particle beam is not limited to the electron beam, and other charged particle beam such as an ion beam may also be used.

Moreover, in the following embodiments, there will be described a writing apparatus capable of correcting geometric aberrations of multi-beams.

First Embodiment

FIGS. 1A to 1C are conceptual diagrams showing a configuration of a writing or "drawing" apparatus according to the first embodiment. In FIG. 1A, a writing apparatus 100 includes a writing unit 150 and a control unit 160. The writing apparatus 100 is an example of a multi charged particle beam writing apparatus. The writing unit 150 includes an electron optical column 102 and a writing chamber 103. In the electron optical column 102, there are arranged an electron source assembly 201, an illumination lens 202, a blanking aperture array 212, a reducing lens 205, a limiting aperture member 206 (blanking aperture), an objective lens 207, an electrode group 214, and an electrostatic lens 218. In the blanking aperture array 212, an aperture member 203 at the side of the electron source assembly 201 (upstream side) and a blanking plate 204 are arranged.

Figure 10:
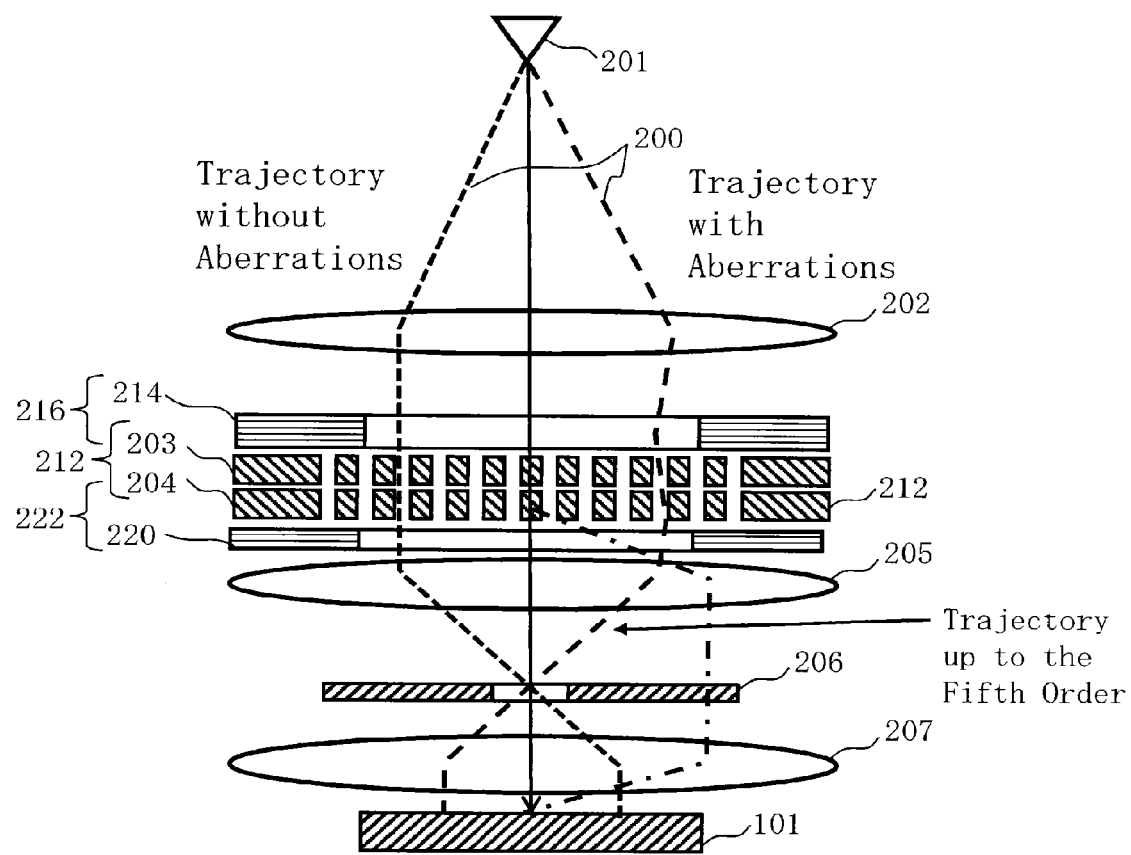
FIG. 10 is a conceptual diagram describing a relation between the structure of the writing apparatus and aberrations according to the second embodiment.

As shown in FIG. 1B, the electrode group 214 (first and second electrodes) is arranged between the illumination lens 202 and the blanking aperture array 212 and composed of at least two stages of electrodes each having a central opening. The electrode group 214 is composed of an electrode (first electrode) which is earthed (connected to ground) at the side of the illumination lens 202 and an electrode (second electrode) which is arranged at a position closest to the blanking aperture array 212 and to which voltage is applied. An electrostatic lens is composed of the electrode group 214. A grating lens 216 (first grating lens) is composed of the electrode group 214 and the aperture member 203. As shown in FIG. 10, an electrostatic lens 218 (correction lens) is composed of at least three stages of electrodes each having a central opening and arranged between the illumination lens 202 and the electrode group 214. The electrostatic lens 218 is an einzel lens including at least two stages of electrodes (third and fourth electrodes) which are earthed (connected to ground) and at least one stage of an electrode (fifth electrode) which is arranged between the third and fourth electrodes and to which voltage is applied.

In the writing chamber 103, there is arranged an XY stage 105. On the XY stage 105, there is placed a target object or "sample" 101 such as a mask serving as a writing target substrate when writing is performed. The target object 101 is, for example, an exposure mask used for manufacturing semiconductor devices, or is a semiconductor substrate (silicon wafer) on which semiconductor elements are formed. The target object 101 may be, for example, a mask blank on which resist has been applied but a pattern has not yet been written.

Both the reducing lens 205 and the objective lens 207 are composed of electromagnetic lenses and arranged so that their magnetic fields on an axis may be in opposite directions and the amount of excitation of each lens may be equal to each other.

The control unit 160 includes a control computer 110, a control circuit 112, lens control circuits 120 and 122, and storage devices 140 and 142 such as magnetic disk drives. The control computer 110, the control circuit 112, the lens control circuits 120 and 122, and the storage devices 140 and 142 are connected to each other through a bus (not shown).

FIGS. 1A to 1C show a configuration necessary for explaining the first embodiment. Other configuration elements generally necessary for the writing apparatus 100 may also be included.

Figure 2B:
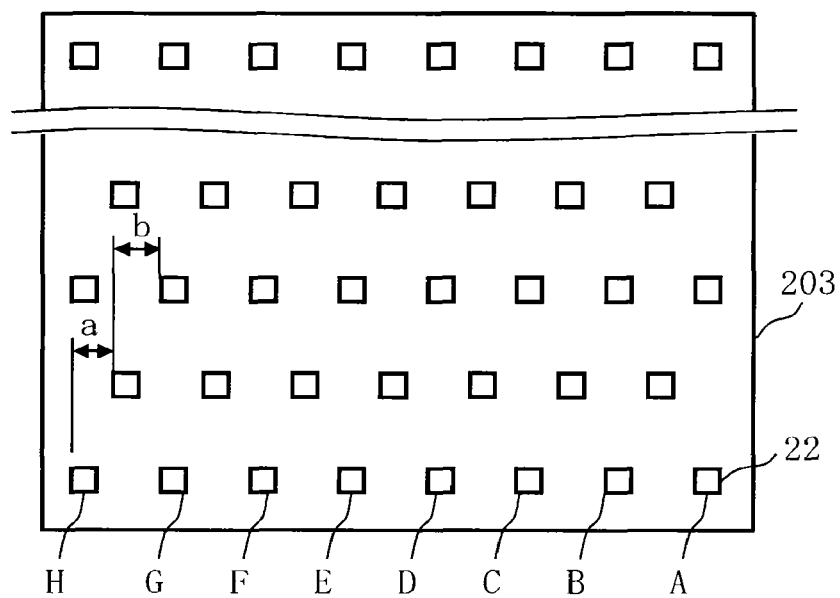

FIGS. 2A and 2B are conceptual diagrams each showing an example of the configuration of an aperture member according to the first embodiment. In FIG. 2A, holes (openings) 22 of m rows long (y direction) and n columns wide (x direction) ($m \geq 2$, $n \geq 2$) are formed, like a matrix, in the aperture member 203 at a predetermined arrangement pitch. In FIG. 2A, for example, holes 22 of 512 (rows)×8 (columns) are formed. Each of the holes 22 is a quadrangle of the same dimensional shape. Alternatively, each of the holes 22 can be a circle of the same circumference. Here, there is shown an example in which each of the rows that are arrayed in the y direction has eight holes 22 from A to H in the x direction. Multi-beams 20 are formed by letting portions of an electron beam 200 respectively pass through a corresponding hole of a plurality of holes 22. The case in which the holes 22 of two or more rows and columns are arranged in both the x and the y directions is shown here, but the arrangement is not limited thereto. For example, it is also acceptable that a plurality of holes 22 are arranged in only one row (x direction) or in only one column (y direction). That is, in the case of only one row, a plurality of holes 22 are arranged as a plurality of columns, and in the case of only one column, a plurality of holes 22 are arranged as a plurality of rows. Moreover, the method of arranging the holes 22 is not limited to the case of FIG. 2A where holes are arranged like a grid in the length and width directions. For example, as shown in FIG. 2B, as to the first and second rows arrayed in the length direction (y direction), each hole in the first row and each hole in the second row may be mutually displaced in the width direction (x direction) by a dimension "a". Similarly, as to the second and third rows arrayed in the length direction (y direction), each hole in the second row and each hole in the third row may be mutually displaced in the width direction (x direction) by a dimension "b", for example.

Figure 3:
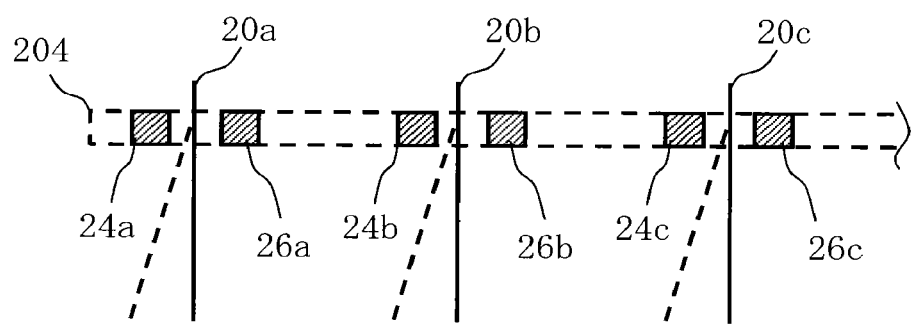
FIG. 3 is a conceptual diagram showing a configuration of a blanking plate according to the first embodiment.

FIG. 3 is a conceptual diagram showing the configuration of a blanking plate according to the first embodiment. In the blanking plate 204, a passage hole is formed to be corresponding to the arrangement position of each hole 22 of the aperture member 203, and a pair of electrodes 24 and 26 (blanker: first deflector) is arranged for each passage hole. An electron beam 20 passing through a corresponding passage hole is deflected by the voltage respectively applied to the two electrodes 24 and 26 being a pair. Blanking control is performed by such deflection. Thus, a plurality of blankers respectively perform blanking deflection of a corresponding beam in the multi-beams having passed through a plurality of holes 22 (openings) of the aperture member 203.

The control computer 110 reads writing data from the storage device 140, and performs data conversion of a plurality of steps so as to generate shot data. The shot data defines, for example, whether or not each irradiation region obtained by dividing the writing surface of the target object 101 into a plurality of grid-like irradiation regions by, for example, the beam size is irradiated, an irradiation time, and the like. Based on the shot data, the control computer 110 outputs a control signal to the control circuit 112, and the control circuit 112 controls the writing unit 150 in accordance with the control signal. Under the control of the control circuit 112, the writing unit 150 writes a pattern on the target object 101 by using the multi-beams 20. At this time, the lens control circuit 120 controls the electrode group 214, and applies a voltage to the electrode group 214. The lens control circuit 122 controls the electrostatic lens 218, and applies a voltage to the electrostatic lens 218. The writing unit 150 operates as described below.

The electron beam 200 emitted from the electron source assembly 201 (emission unit) almost perpendicularly (e.g., vertically) illuminates the whole of the aperture member 203 by the illumination lens 202. A plurality of holes (openings) each being a quadrangle are formed in the aperture member 203. The region including all the plurality of holes is irradiated with the electron beam 200. For example, a plurality of quadrangular electron beams (multi-beams) 20a to 20e are formed by letting portions of the electron beam 200 irradiating the positions of a plurality of holes pass through a corresponding hole of the plurality of holes of the aperture member 203 respectively. The multi-beams 20a to 20e respectively pass through corresponding blankers (first deflectors) of the blanking plate 204. Each blanker deflects (performs blanking deflection) the passing electron beam 20. The multi-beams 20a, 20b, . . . , 20e, having passed through the blanking plate 204 are reduced by the reducing lens 205, and travel toward the hole at the center of the limiting aperture member 206. At this time, the electron beam 20 deflected by the blanker of the blanking plate 204 deviates from the hole at the center of the limiting aperture member 206 (blanking aperture member) and is blocked by the limiting aperture member 206. On the other hand, the electron beam 20 not deflected by the blanker of the blanking plate 204 passes through the hole at the center of the limiting aperture member 206. Blanking control is performed by ON/OFF of the blanker so as to control ON/OFF of the beam. Thus, the limiting aperture member 206 blocks each beam which was deflected to be in the OFF state by each of a plurality of blankers. One beam shot is formed by a beam which has been formed during from a beam ON state to a beam OFF state and has passed through the limiting aperture member 206. Pattern images of the multi-beams 20 having passed through the limiting aperture member 206 are focused by the objective lens 207 so as to irradiate respective beam irradiation positions on the target object 101.

The writing apparatus 100 performs a writing operation by a raster scan method by which shot beams are successively emitted in order while the XY stage 105 is moving, and when a desired pattern is written, a necessary beam is controlled to be beam-ON by blanking control according to the pattern.

Figure 4A:
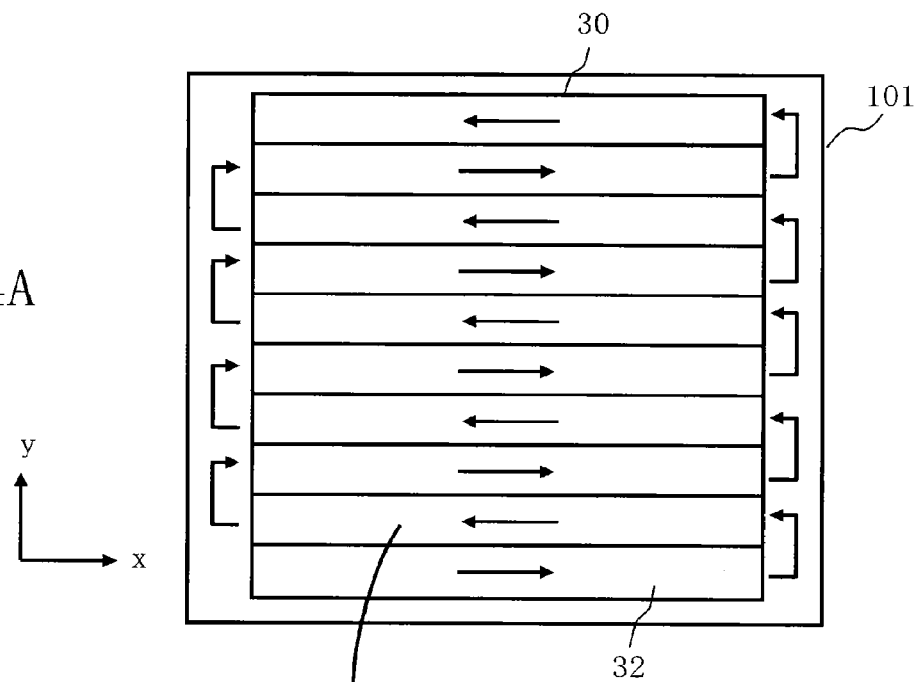
FIGS. 4A to 4C are conceptual diagrams explaining a writing operation according to the first embodiment.
Figure 4B:
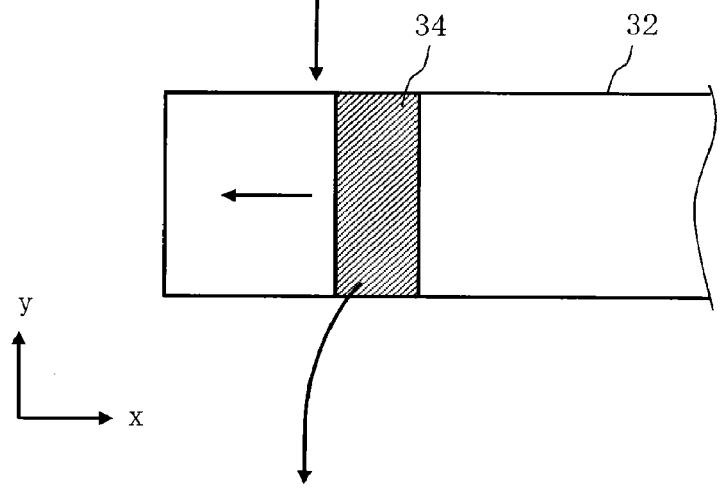
Figure 4C:
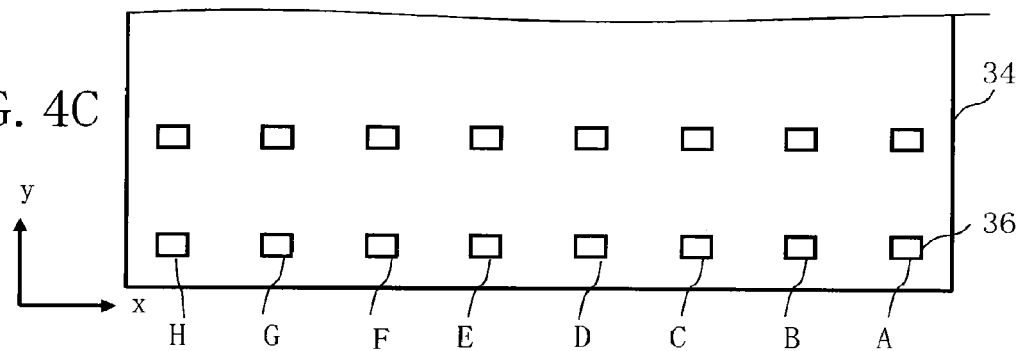

FIGS. 4A to 4C are conceptual diagrams explaining a writing operation according to the first embodiment. As shown in FIG. 4A, a writing region 30 of the target object 101 is virtually divided into a plurality of stripe regions 32 each in a strip shape and each having a predetermined width in the y direction, for example. Each of the stripe regions 32 serves as a unit of writing region. First, the XY stage 105 is moved to make an adjustment such that an irradiation region 34 which can be irradiated by one-time irradiation of the multi-beams 20 is located at the left end of the first stripe region 32 or at a position more left than the left end, and then writing is started. When writing the first stripe region 32, the writing advances relatively in the x direction by moving the XY stage 105 in the −x direction, for example. The XY stage 105 is continuously moved at a predetermined speed, for example. After writing the first stripe region 32, the stage position is moved in the −y direction to make an adjustment such that the irradiation region 34 is located at the right end of the second stripe region 32 or at a position more right than the right end, to be relatively located in the y direction. Then, similarly, as shown in FIG. 4B, writing advances in the −x direction by moving the XY stage 105 in the x direction, for example. That is, writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also preferable to perform writing in the same direction when writing each stripe region 32. By one shot, as shown in FIG. 4C, a plurality of shot patterns 36 whose number is equal to the number of the holes 22 are formed at a time by multi-beams which have been formed by passing through respective corresponding holes 22 of the aperture member 203. For example, a beam which passed through a hole A of the aperture plate member 203 irradiates the position "A" shown in FIG. 4C to form the shot pattern 36 at this position. Similarly, a beam which passed through a hole B of the aperture member 203 irradiates the position "B" shown in FIG. 4C to form the shot pattern 36 at this position, for example. A similar operation applies to C to H. Thus, the writing apparatus 100 writes a pattern in each stripe 32 by the raster scan method by which shot beams are successively emitted in order while the XY stage 105 is moving in the x direction.

Figure 5:
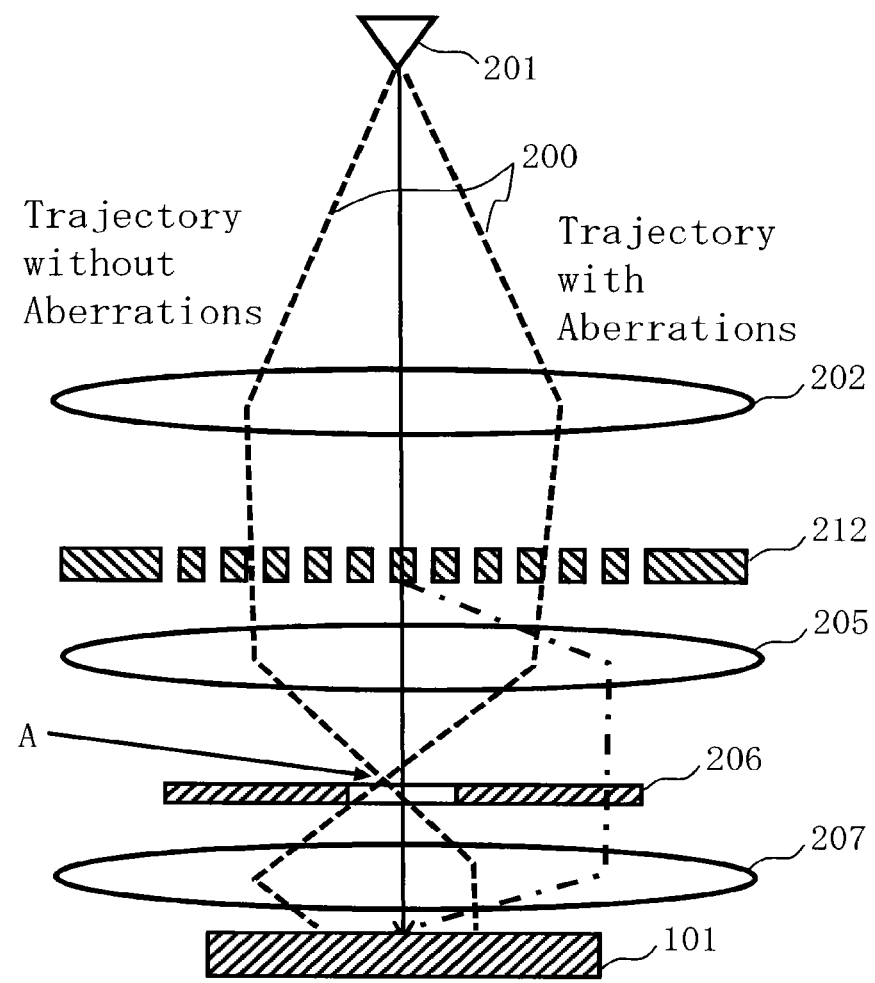
FIG. 5 is a conceptual diagram describing a relation between the structure of a writing apparatus and aberrations according to Comparative Example 1 with respect to the first embodiment.

FIG. 5 is a conceptual diagram describing the relation between the structure of a writing apparatus and aberrations according to Comparative Example 1 with respect to the first embodiment. Comparative Example 1 shown in FIG. 5 is the same as the writing unit 150 of FIG. 1 except that the electrode group 214 and the electrostatic lens 218 do not exist. In multi beam writing, as described above, since the beam size of the entire multi-beams is large, aberrations (particularly spherical aberration) on the optical axis of a crossover image forming system become large. Therefore, it is necessary to form the limiting aperture 206 (contrast aperture) for blanking, arranged near a crossover, to have a large aperture diameter (refer to portion A in FIG. 5). However, when the diameter of the aperture is large, a new problem occurs in that it becomes necessary to increase a blanking voltage for blanking control.

Figure 6:
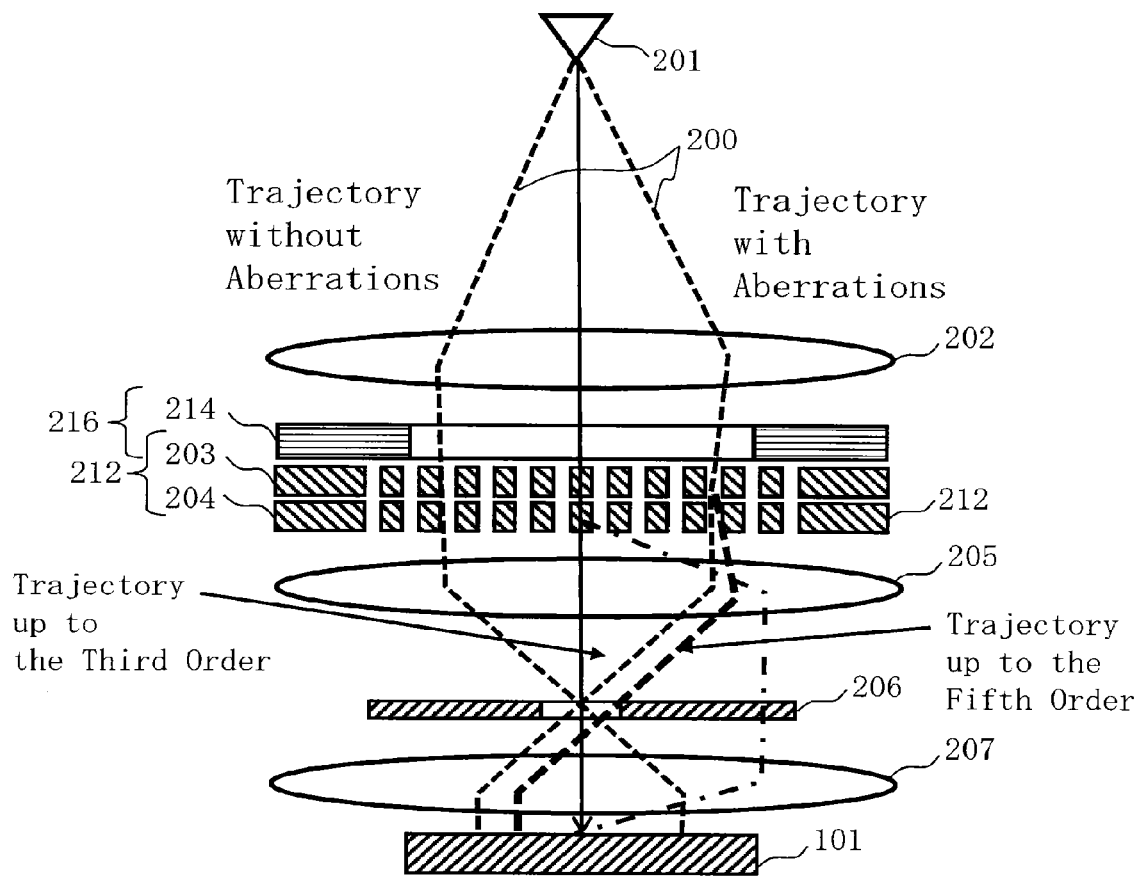
FIG. 6 is a conceptual diagram describing a relation between the structure of a writing apparatus and aberrations according to Comparative Example 2 with respect to the first embodiment.

FIG. 6 is a conceptual diagram describing the relation between the structure of a writing apparatus and aberrations according to Comparative Example 2 with respect to the first embodiment. Comparative Example 2 shown in FIG. 6 is the same as the writing unit 150 of FIGS. 1A to 1C except that the electrostatic lens 218 does not exist. In other words, in Comparative Example 2 of FIG. 6, the electrode group 214 is arranged between the illumination lens 202 and the blanking aperture array 212, and the grating lens 216 is composed of the electrode group 214 and the aperture member 203. The grating lens is effective in correcting spherical aberration. By using the grating lens, spherical aberrations up to the third order can be corrected. However, when only the grating lens 216 of Comparative Example 2 of FIG. 6 is used, spherical aberration of the fifth order remains. That is, while spherical aberrations up to the third order can be reduced by using the grating lens 216, spherical aberration of the fifth order (high order) increases.

Originally, in the state of Comparative Example 1 of FIG. 5, spherical aberration of third order is large and spherical aberration of the fifth order is small. Then, in Comparative Example 2 of FIG. 6, since the grating lens with negative spherical aberration is used, when both the states are united, spherical aberration of the third order reduces but spherical aberration of the fifth order increases. For example, with respect to coordinates x and y of the electron trajectory on the surface of the target object and derivatives x' and y' relating to coordinate z of the central axis of the electron trajectory, when w is expressed as w=x+iy (where i is an imaginary unit) and w' is expressed as w'=x'+iy' (where ' denotes a derivative relating to the coordinate z of the central axis of the electron trajectory), aberration proportional to wb'w'w' being a product of two w's and one wb' (where wb' is a complex conjugate of w') is the third order spherical aberration in the system of a rotational symmetry with respect to the z axis. Moreover, aberration proportional to wb'wb'w'w'w' being a product of three w's and two wb's is the fifth order spherical aberration (where b is a complex conjugate). In the conventional system, the fifth order aberration has not been a problem. However, when the third order aberration is corrected, it becomes necessary to consider the fifth order aberration. According to the first embodiment, spherical aberration of the fifth order is also corrected.

Figure 7:
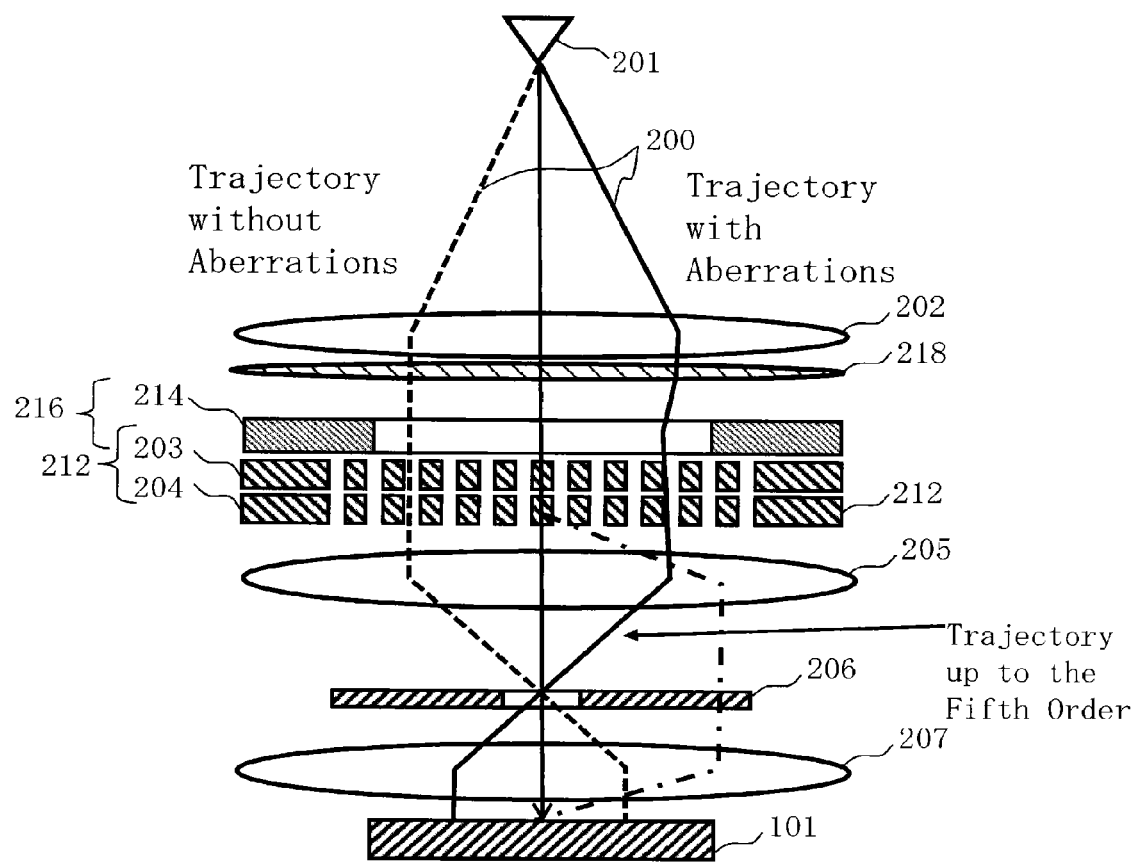
FIG. 7 is a conceptual diagram describing a relation between the structure of a writing apparatus and aberrations according to the first embodiment.

FIG. 7 is a conceptual diagram describing the relation between the structure of the writing apparatus and aberrations according to the first embodiment. As shown in FIG. 7, in the writing apparatus 100 of the first embodiment, the electrostatic lens 218 (correction lens) is arranged between the illumination lens 202 and the electrode group 214. The electrostatic lens 218 corrects high order (e.g., fifth order) spherical aberration produced by the grating lens 216.

FIGS. 8A to 8C are examples each showing the relation between the amount of trajectory displacement of multi-beams and the voltage applied to the lens according to the first embodiment. In FIGS. 8A to 8C, the ordinate axis shows the amount of trajectory displacement of multi-beams and the abscissa axis shows the voltage applied to the lens. FIG. 8A shows the state in which spherical aberrations up to the third order have been reduced using the grating lens 216. However, as shown in FIG. 8A, while the spherical aberration up to the third order have been reduced, spherical aberration of the fifth order increases. Then, according to the first embodiment, as shown in FIG. 8B, voltage is set such that the third order spherical aberration and the fifth order spherical aberration are daringly produced by the electrostatic lens 218. In that case, as shown in FIG. 8C, voltage is set such that the third order spherical aberration and the fifth order spherical aberration are daringly produced by the electrostatic lens 218 in order that the remaining third order spherical aberration after using the grating lens 216 and the fifth order spherical aberration produced using the grating lens 216 may cancel each other out as much as possible. In other words, lens values (voltages) are respectively applied to the electrode group 214 and the electrostatic lens 218 such that the third order spherical aberration and the fifth order spherical aberration are cancelled out each other by using the grating lens 216 and the electrostatic lens 218. Consequently, by the control described above, the amount of trajectory displacement of multi-beams can be reduced as shown in FIG. 8C.

With respect to voltages to be applied to the grating lens 216 and the electrostatic lens 218 (correction lens), a relation of voltage group (or voltage ratio) under which spherical aberration of the third order and spherical aberration of the fifth order become as small as possible using the grating lens 216 and the electrostatic lens 218 (correction lens) can be acquired in advance through experiment etc. Correlation data on an acquired voltage group (or voltage ratio) is stored as a correlation table in the storage device 142. When the writing apparatus 100 is started and adjusted, the control computer 110 reads the correlation table from the storage device 142, reads a voltage group (or voltage ratio) under which the amount of trajectory displacement becomes smaller from the correlation table, and outputs control signals each indicating a corresponding voltage of the voltage group to the lens control circuits 120 and 122. The lens control circuit 120 applies a voltage in the relation of the voltage group (or voltage ratio) to the electrode group 214, and the lens control circuit 122 applies the other voltage in the relation of the voltage group (or voltage ratio) to the electrostatic lens 218.

As described above, according to the first embodiment, it is possible to correct geometric aberrations of multi-beams. Therefore, the diameter of the aperture for blanking can be small and a blanking voltage can also be small. Moreover, according to the first embodiment, it is possible to correct, particularly, high order geometric aberrations of multi-beams.

Second Embodiment

In the first embodiment, there has been described an example where a correction lens for correcting high order aberrations is arranged between the illumination lens 202 and the electrode group 214, but it is not limited thereto. In the second embodiment, a case where a correction lens is arranged at a position different from that of the first embodiment will be described.

Figure 9:
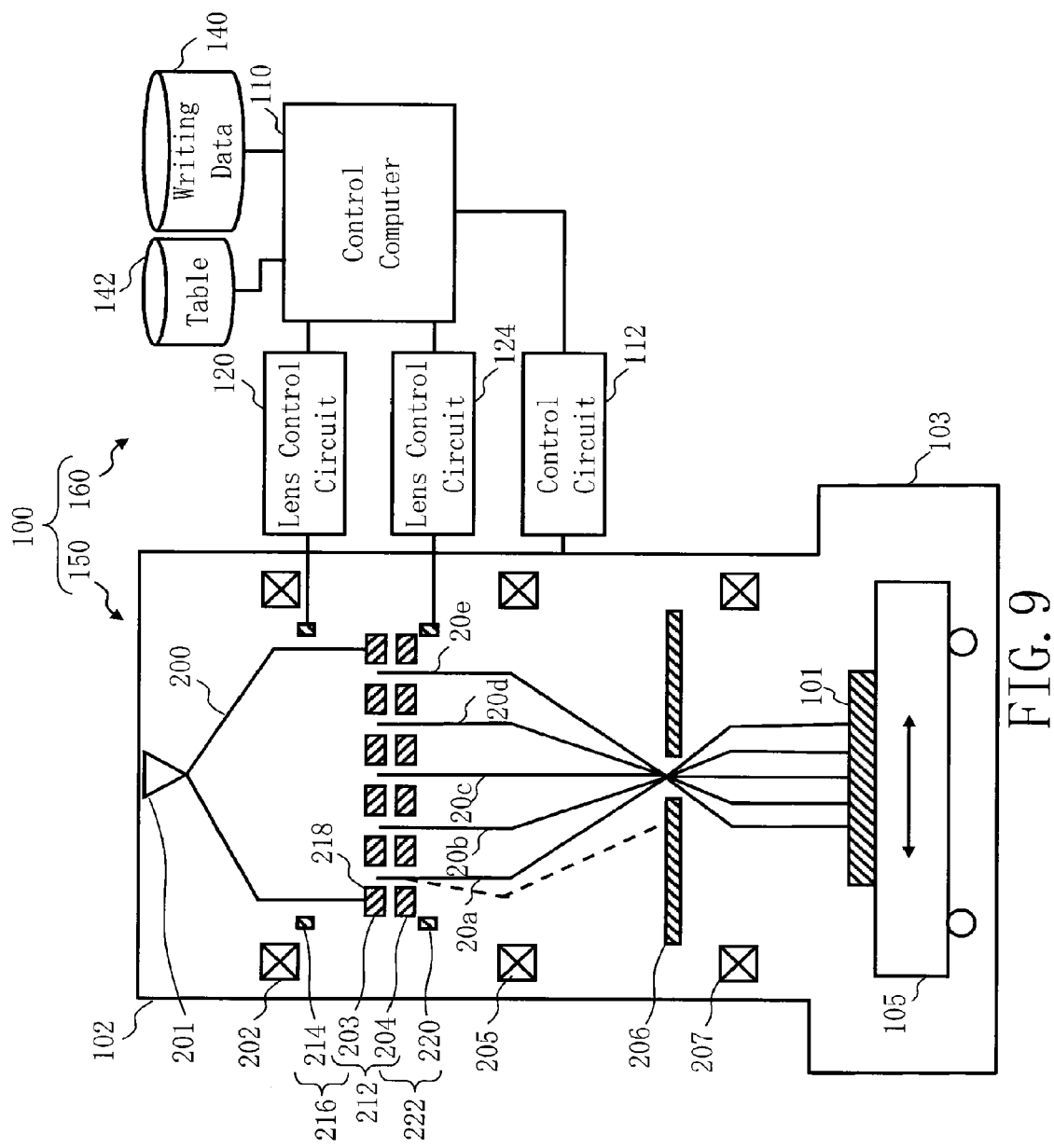
FIG. 9 is a schematic diagram showing a configuration of a writing apparatus according to a second embodiment.

FIG. 9 is a schematic diagram showing the configuration of a writing apparatus according to the second embodiment. FIG. 9 is the same as FIG. 1A except that an electrostatic lens 220 (correction lens) instead of the electrostatic lens 218 is arranged between the blanking aperture array 212 and reducing lens 205, and that a lens control circuit 124 which controls the electrostatic lens 220 is arranged instead of the lens control circuit 122. It is preferable that the electrostatic lens 220 is arranged just below the blanking aperture array 212. The electrostatic lens 220 (correction lens) configures a grating lens 222, being different from the grating lens 216, by using the blanking plate 204 as gratings. Therefore, the electrostatic lens 220 (correction lens) is arranged opposite the grating lens 216 with respect to the aperture member 203 or the blanking plate 204. The contents of the present embodiment are the same as those of the first embodiment except what is described below.

FIG. 10 is a conceptual diagram describing the relation between the structure of the writing apparatus and aberrations according to the second embodiment. As shown in FIG. 10, in the writing apparatus 100 of the second embodiment, the electrostatic lens 220 (correction lens) is arranged opposite the grating lens 216 with respect to the aperture member 203 or the blanking plate 204. The electrostatic lens 220 configures the grating lens 222, and corrects a high order spherical aberration (e.g., fifth order) produced by the grating lens 216. Multi-beams whose aberrations up to the third order have been corrected using the grating lens 216 proceed ahead while remaining in the state of a largely produced fifth order spherical aberration, which continues until the multi-beams pass through the aperture member 203. By the grating lens 222 (second grating lens) composed of the blanking plate 204 and the electrostatic lens 220, the third order spherical aberration and the fifth order spherical aberration are suppressed. Consequently, the spherical aberrations produced in multi-beams are corrected so that trajectory displacement of the multi-beams may become smaller.

With respect to voltages to be applied to the grating lens 216 (electrode group 214) and the grating lens 222 (electrostatic lens 220: correction lens), a relation of voltage group (or voltage ratio) under which spherical aberration of the third order and spherical aberration of the fifth order become as small as possible using the grating lens 216 and the grating lens 222 (electrostatic lens 220: correction lens) can be acquired in advance through experiment etc. Correlation data on an acquired voltage group (or voltage ratio) is stored as a correlation table in the storage device 142. When the writing apparatus 100 is started and adjusted, the control computer 110 reads the correlation table from the storage device 142, reads a voltage group (or voltage ratio) under which the amount of trajectory displacement becomes smaller from the correlation table, and outputs control signals each indicating a corresponding voltage of the voltage group to the lens control circuits 120 and 124. The lens control circuit 120 applies a voltage in the relation of the voltage group (or voltage ratio) to the electrode group 214, and the lens control circuit 124 applies the other voltage in the relation of the voltage group (or voltage ratio) to the electrostatic lens 220.

As described above, according to the second embodiment, it is possible to correct high order geometric aberrations of multi-beams similarly to the first embodiment. In the case of the second embodiment, high order geometric aberrations of multi-beams can be corrected by using the grating lens combined with the correction lens utilizing the blanking plate 204.

Third Embodiment

In the first and second embodiments, there has been described an arrangement in which a correction lens for correcting high order aberrations is arranged at a position not associated with the magnetic field of an electromagnetic lens, such as the illumination lens 202 and the reducing lens 205, but it is not limited thereto.

Figure 11:
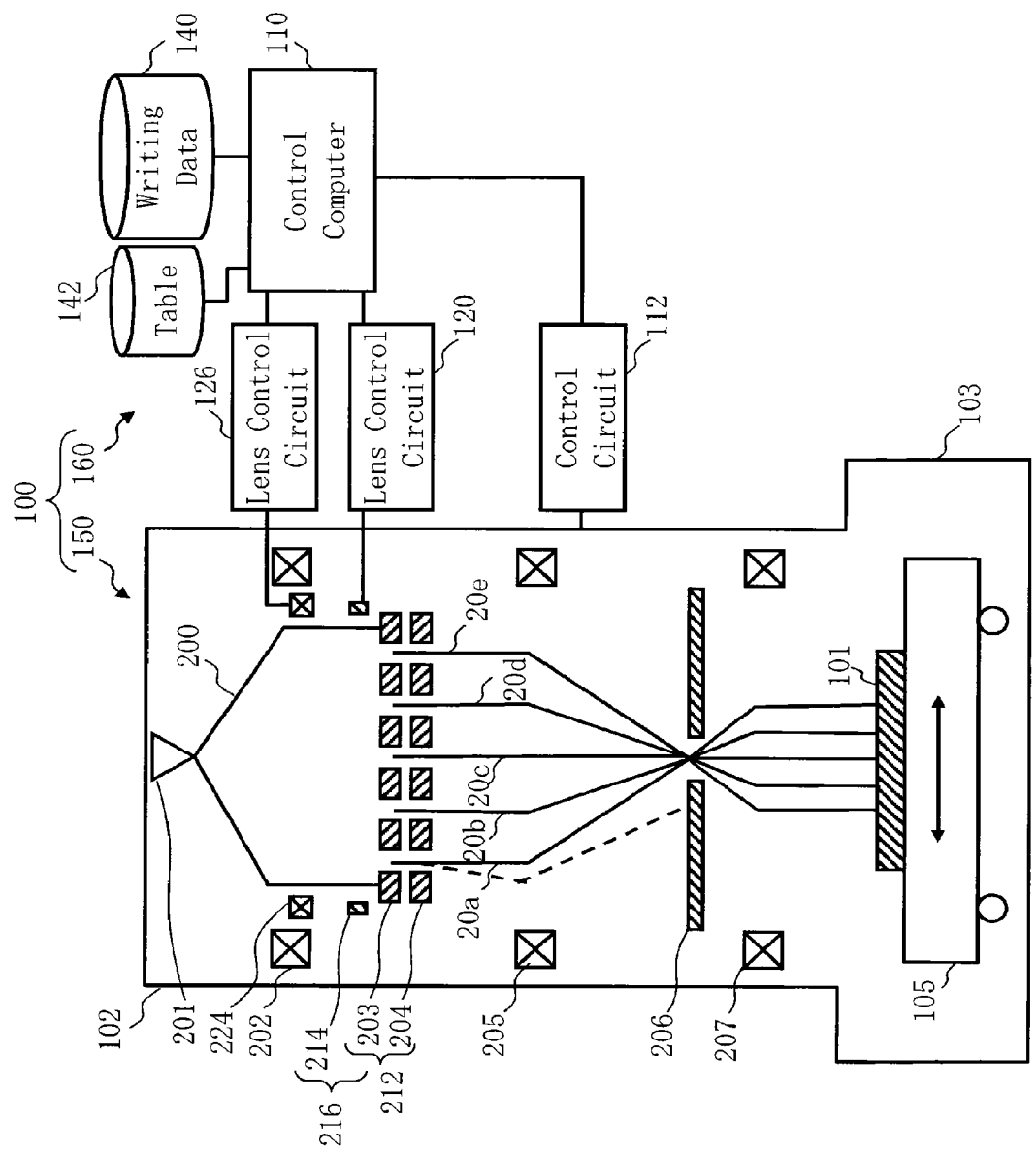
FIG. 11 is a schematic diagram showing a configuration of a writing apparatus according to a third embodiment.

FIG. 11 is a schematic diagram showing the configuration of a writing apparatus according to the third embodiment. FIG. 11 is the same as FIG. 1 except that a coil lens (electromagnetic lens) 224 (correction lens) instead of the electrostatic lens 218 is arranged in the magnetic field of the illumination lens 202, and that a lens control circuit 126 for controlling the coil lens 224 is arranged instead of the lens control circuit 122. It is preferable if the coil lens 224 is arranged at a position completely included in the magnetic field of the illumination lens 202 so that the influence of the magnetic field generated by the voltage applied to the coil lens 224 may efficiently act on the magnetic field of the illumination lens 202. The contents of the present embodiment are the same as those of the first embodiment except what is described below.

With respect to voltages to be applied to the grating lens 216 (electrode group 214) and the coil lens 224 (correction lens), a relation of voltage group (or voltage ratio) under which spherical aberration of the third order and spherical aberration of the fifth order become as small as possible using the grating lens 216 and the coil lens 224 can be acquired in advance through experiment etc. Correlation data on an acquired voltage group (or voltage ratio) is stored as a correlation table in the storage device 142. When the writing apparatus 100 is started and adjusted, the control computer 110 reads the correlation table from the storage device 142, reads a voltage group (or voltage ratio) under which the amount of trajectory displacement becomes smaller from the correlation table, and outputs control signals each indicating a corresponding voltage of the voltage group to the lens control circuits 120 and 126. The lens control circuit 120 applies a voltage in the relation of the voltage group (or voltage ratio) to the electrode group 214, and the lens control circuit 126 applies the other voltage in the relation of the voltage group (or voltage ratio) to the coil lens 224.

As described above, according to the third embodiment, it is possible to correct high order geometric aberrations of multi-beams similarly to the first embodiment. In the case of the third embodiment, high order geometric aberrations of multi-beams can be corrected by arranging a correction lens in the magnetic field of an electromagnetic lens of the illumination system.

Fourth Embodiment

In embodiments described above, the configuration based on the premise of the grating lens 216 utilizing the aperture member 203 has been explained. In the fourth embodiment, there will be described a case in which the grating lens 216 utilizing the aperture member 203 is not used.

Figure 12:
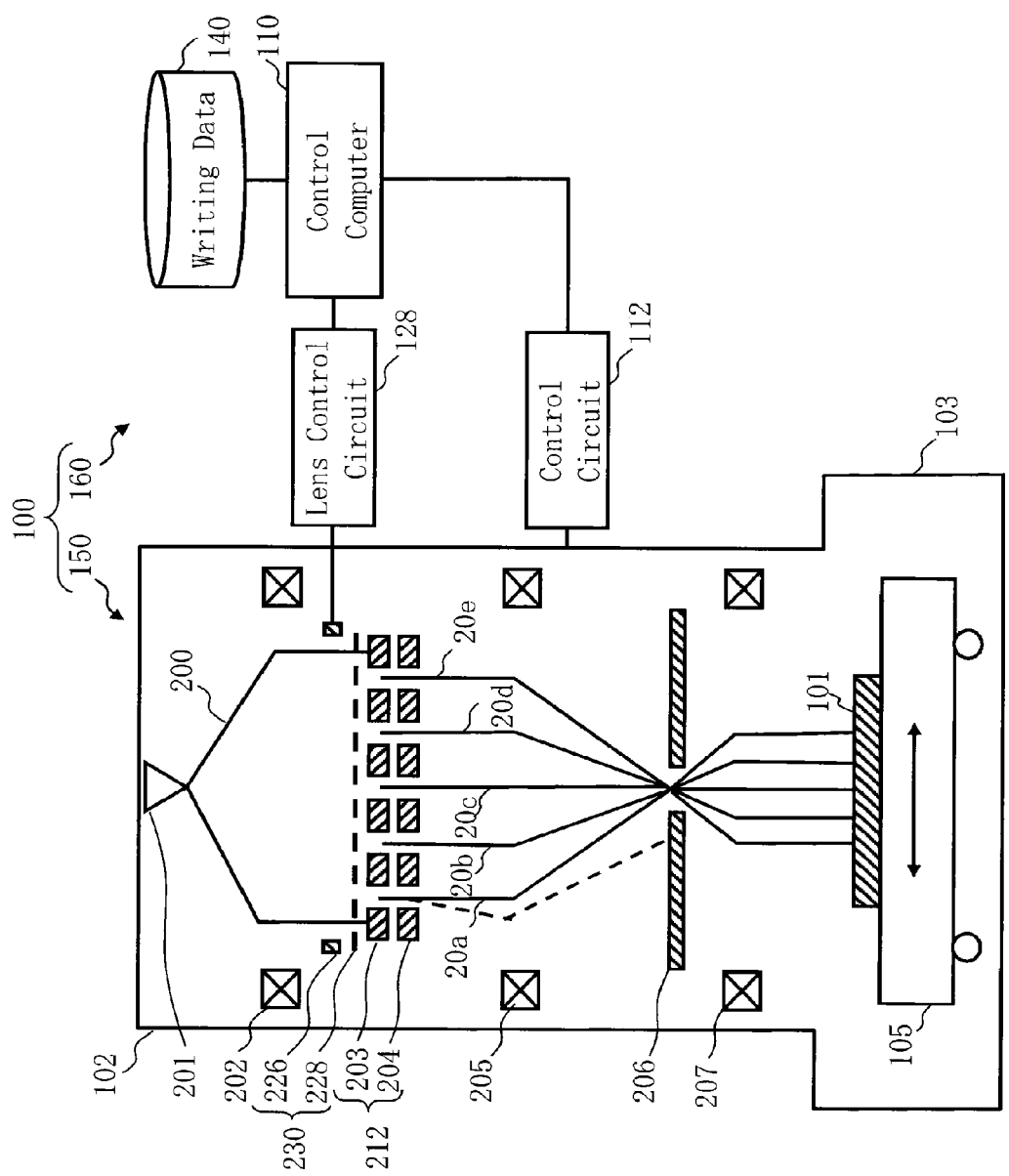
FIG. 12 is a schematic diagram showing a configuration of a writing apparatus according to a fourth embodiment.

FIG. 12 is a schematic diagram showing the configuration of a writing apparatus according to the fourth embodiment. FIG. 12 is the same as FIG. 1 except that a foil lens 230 instead of the electrode group 214 and the electrostatic lens 218 is arranged between the illumination lens 202 and the blanking aperture array 212, and that a lens control circuit 128 for which controls the foil lens 230 (electrostatic lens 226) is arranged instead of the lens control circuits 120 and 122. The foil lens 230 includes the electrostatic lens 226 and a foil 228. The contents of the present embodiment are the same as those of the first embodiment except what is described below.

In the embodiments described above, the electrode group 214 needs to be arranged close to the aperture member 203 in order that the grating lens 216 may be configured utilizing the aperture member 203. On the other hand, according to the fourth embodiment, since the foil lens 230 including the foil 228 is used, it is possible to avoid limiting the arrangement position to be close to the aperture member 203.

Here, the foil 228 is made of a member transmittable through an electron (charged particle). For example, it is preferable to use a diamond-like carbon (DLC) thin film, graphene, or the like. By using DLC, graphene, or the like composed of carbon having a small atomic number, scattering of electrons at the foil can be reduced. The foil 228 is configured to be larger than the size of the entire multi-beams, and arranged to be overlapped with the entire multi-beams or the whole of a plurality of apertures of the aperture member 203.

In the case of FIG. 12, as the foil lens 230, the electrostatic lens 226 is arranged at the upstream side and the foil 228 is arranged at the downstream side, but the arrangement position may be reversed.

Spherical aberrations of an electron beam (multi-beams) are corrected by the foil lens 230.

Figure 13:
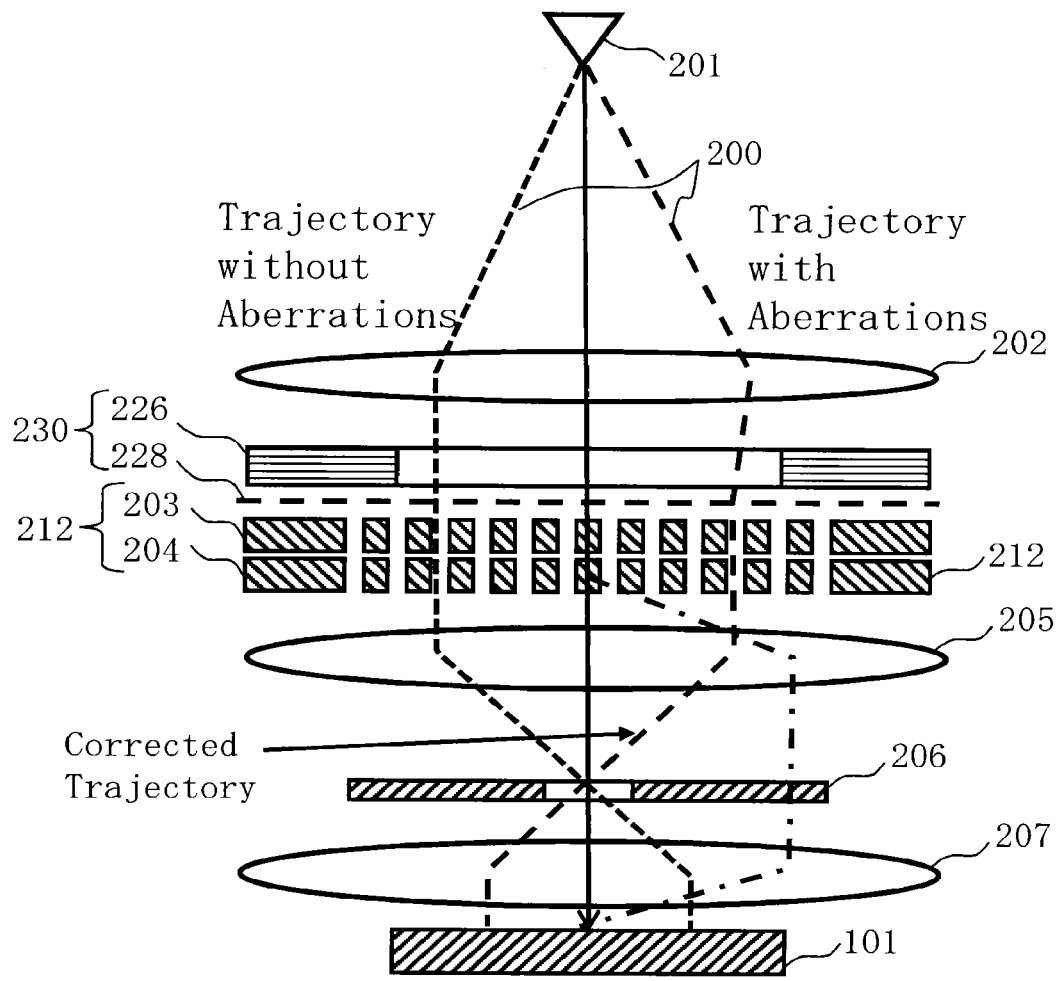
FIG. 13 is a conceptual diagram describing a relation between the structure of a writing apparatus and aberrations according to the fourth embodiment.

FIG. 13 is a conceptual diagram describing the relation between the structure of the writing apparatus and aberrations according to the fourth embodiment. As shown in FIG. 13, in the writing apparatus 100 of the fourth embodiment, the foil lens 230 is arranged between the illumination lens 202 and the aperture member 203. Spherical aberrations up to the third order of an electron beam (multi-beams) can be corrected by the foil lens 230. In the example of FIG. 13, although the spherical aberration of the fifth order still remains, since there is no restriction of arrangement position with respect to the aperture member 203, the degree of freedom of design can be increased.

The lens control circuit 128 applies voltage to correct the spherical aberration of the third order to the electrostatic lens 226.

By combining the correction lens of one of embodiments of the first to third with the configuration of the fourth embodiment, high order spherical aberrations are corrected.

The embodiments have been explained referring to concrete examples described above. However, the present invention is not limited to these specific examples. The raster scanning operation described above is just an example, and it is also acceptable to use other operation method instead of the raster scanning operation using multiple beams.

While the apparatus configuration, control method, and the like not directly necessary for explaining the present invention are not described, some or all of them may be suitably selected and used when needed. For example, although description of the configuration of the control unit for controlling the writing apparatus 100 is omitted, it should be understood that some or all of the configuration of the control unit is to be selected and used appropriately when necessary.

In addition, any other multi charged particle beam writing apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing apparatus comprising:
    a stage configured to mount a target object thereon and to be continuously movable;
    an emission unit configured to emit a charged particle beam;
    an aperture member, in which a plurality of openings are formed, configured to form multiple beams by letting a region including a whole of the plurality of openings be irradiated with the charged particle beam and letting portions of the charged particle beam respectively pass through a corresponding opening of the plurality of openings;
    a blanking plate in which there are arranged a plurality of blankers configured to respectively perform blanking deflection for a corresponding beam in the multiple beams having passed through the plurality of openings of the aperture member;
    a blanking aperture member configured to block each beam having been deflected to be in OFF state by at least one of the plurality of blankers;
    a first grating lens, using the aperture member as gratings, configured to correct spherical aberration of the charged particle beam; and
    a correction lens configured to correct high order spherical aberration produced by the first grating lens.

2. The apparatus according to claim 1, wherein a first electrostatic lens is used as the correction lens to correct the high order spherical aberration.

3. The apparatus according to claim 1, wherein
    the correction lens to correct the high order spherical aberration configures a second grating lens, being different from the first grating lens, using the blanking plate as gratings, and
    the correction lens is arranged opposite the first grating lens with respect to one of the aperture member and the blanking plate.

4. The apparatus according to claim 1, further comprising:
    an illumination lens configured to illuminate the charged particle beam onto the region of the aperture member,
    wherein a coil lens is arranged, as the correction lens to correct the high order spherical aberration, in a magnetic field of the illumination lens.

5. The apparatus according to claim 1, wherein the first grating lens includes a second electrostatic lens.

6. The apparatus according to claim 5, wherein the second electrostatic lens includes an electrode group composed of at least two stages each having a central opening.

7. The apparatus according to claim 6, further comprising:
    an illumination lens configured to illuminate the charged particle beam onto the region of the aperture member,
    wherein the second electrostatic lens includes a first electrode grounded at a side of the illumination lens, and a second electrode which is arranged at a position closest to the aperture member and to which voltage is applied.

8. The apparatus according to claim 2, wherein the first electrostatic lens includes an electrode group composed of at least three stages each having a central opening.

9. The apparatus according to claim 2, wherein the first electrostatic lens includes a third electrode and a fourth electrode which are grounded, and a fifth electrode which is arranged between the third electrode and the fourth electrode and to which voltage is applied.

10. A multi charged particle beam writing apparatus comprising:
    a stage configured to mount a target object thereon and to be continuously movable;
    an emission unit configured to emit a charged particle beam;
    an aperture member, in which a plurality of openings are formed, configured to form multiple beams by letting a region including a whole of the plurality of openings be irradiated with the charged particle beam and letting portions of the charged particle beam respectively pass through a corresponding opening of the plurality of openings;
    a blanking plate in which there are arranged a plurality of blankers configured to respectively perform blanking deflection for a corresponding beam in the multiple beams having passed through the plurality of openings of the aperture member;
    an illumination lens configured to illuminate the charged particle beam onto the region of the aperture member;
    a blanking aperture member configured to block each beam having been deflected to be in OFF state by at least one of the plurality of blankers; and
    a foil lens, arranged between the illumination lens and the aperture member, configured to correct spherical aberration of the charged particle beam.

* * * * *